(12) United States Patent
Tsuboi et al.

(10) Patent No.: US 8,742,708 B2
(45) Date of Patent: Jun. 3, 2014

(54) ELECTRIC POWER CONVERSION APPARATUS FOR VEHICLE

(75) Inventors: Takashi Tsuboi, Okazaki (JP); Katsuhisa Mase, Chita-gun (JP); Yasuyoshi Toda, Toyohashi (JP)

(73) Assignee: Denso Corporation, Kariya (JP)

( * ) Notice: Subject to any disclaimer, the term of this patent is extended or adjusted under 35 U.S.C. 154(b) by 318 days.

(21) Appl. No.: 12/729,529

(22) Filed: Mar. 23, 2010

(65) Prior Publication Data

US 2010/0270958 A1  Oct. 28, 2010

(30) Foreign Application Priority Data

Apr. 24, 2009 (JP) ................................. 2009-106493

(51) Int. Cl.
*H02H 7/08* (2006.01)
(52) U.S. Cl.
USPC .............. 318/400.21; 318/432; 318/400.27; 318/474; 318/490; 257/331; 257/332; 257/341; 257/E21.41; 180/443; 438/270
(58) Field of Classification Search
USPC ............. 318/432, 400.21, 400.27, 474, 490; 257/331, 332, 341, E21.41; 180/443; 438/270
See application file for complete search history.

(56) References Cited

U.S. PATENT DOCUMENTS

| | | | |
|---|---|---|---|
| 6,504,467 B1 | 1/2003 | Berberich et al. | |
| 6,600,194 B2* | 7/2003 | Hueting et al. | 257/331 |
| 6,653,740 B2* | 11/2003 | Kinzer et al. | 257/778 |
| 2008/0265314 A1 | 10/2008 | Kobayashi | |
| 2009/0267551 A1* | 10/2009 | Shibata | 318/400.21 |
| 2010/0079095 A1* | 4/2010 | Shibata | 318/474 |
| 2010/0109588 A1* | 5/2010 | Koike | 318/400.21 |
| 2011/0005855 A1* | 1/2011 | Mikamo et al. | 180/443 |
| 2011/0081756 A1 | 4/2011 | Kobayashi | |
| 2011/0285336 A1* | 11/2011 | Fujita et al. | 318/400.27 |
| 2012/0032625 A1* | 2/2012 | Suzuki | 318/490 |

FOREIGN PATENT DOCUMENTS

| | | | | |
|---|---|---|---|---|
| JP | S59-217368 | 12/1984 | | |
| JP | H01-191477 | 8/1989 | | |
| JP | 05234495 A | * 9/1993 | ............ | H01H 85/30 |
| JP | H05-234495 | 9/1993 | | |
| JP | H06-244414 | 9/1994 | | |

(Continued)

OTHER PUBLICATIONS

Japanese Office Action dated Nov. 22, 2011, issued in corresponding Japanese Application No. 2009-106493 with English Translation.

(Continued)

*Primary Examiner* — Erick Glass

(74) *Attorney, Agent, or Firm* — Nixon & Vanderhye PC

(57) ABSTRACT

In an electric power steering system, a drain terminal side of a semiconductor relay is positioned to face a heat sink through an insulation film layer. The semiconductor relay has a source terminal between a gate terminal and a drain terminal. The source terminal is provided between the gate terminal and the drain terminal with respect to parts of the gate terminal, the drain terminal and the source terminal, which extend generally in parallel each other on the same plane.

14 Claims, 4 Drawing Sheets

(56) References Cited

FOREIGN PATENT DOCUMENTS

| | | |
|---|---|---|
| JP | 11-284187 | 10/1999 |
| JP | A-2001-67997 | 3/2001 |
| JP | 2003-250278 | 9/2003 |
| JP | 2004-186536 | 7/2004 |
| JP | 2004186536 A * | 7/2004 ............. H01L 21/60 |
| JP | 2005-280615 | 10/2005 |
| JP | 2006-021645 | 1/2006 |
| JP | 2006-21645 | 1/2006 |
| JP | 2006021645 A * | 1/2006 |
| JP | 2006-060889 | 3/2006 |
| JP | 2006-216989 | 8/2006 |
| JP | 2007-037207 | 2/2007 |
| JP | 2007-060733 | 3/2007 |
| JP | 2007-073581 | 3/2007 |
| JP | 2008-174097 | 7/2008 |

OTHER PUBLICATIONS

Japanese Office Action dated Mar. 1, 2011, issued in corresponding Japanese Application No. 2009-106493 with English Translation.

Decision of Rejection (1 pg.) dated Jun. 8, 2012 issued in corresponding Japanese Application No. 2009-106493 with an at least partial English-language translation thereof (1 pg.).

Decision of Rejection of Amendment (1 pg.) dated Jun. 8, 2012 issued in corresponding Japanese Application No. 2009-106493 with an at least partial English-language translation thereof (2 pgs.).

Office Action (3 pgs.) dated May 28, 2012 issued in corresponding Canadian Application No. 2,695,263.

Office Action (3 pages) dated Jun. 27, 2013, issued in corresponding Canadian Application No. 2,695,263.

* cited by examiner

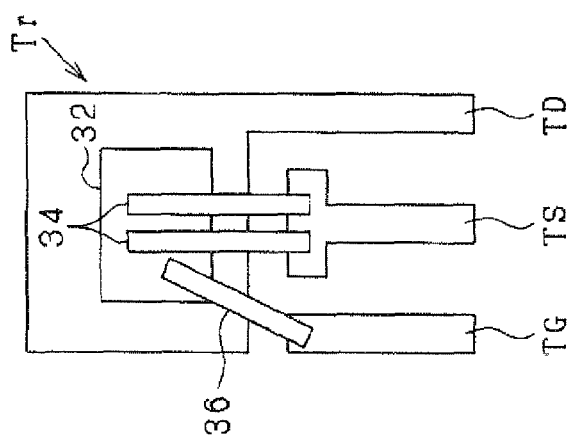
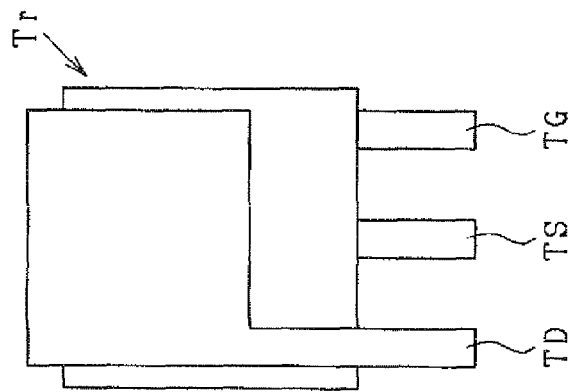
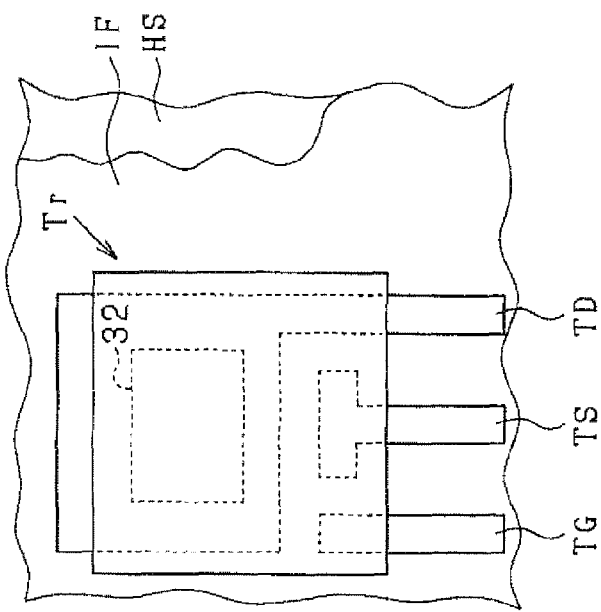

ELECTRIC POWER CONVERSION APPARATUS FOR VEHICLE

CROSS REFERENCE TO RELATED APPLICATION

This application is based on and incorporates herein by reference Japanese Patent Application No. 2009-106493 filed on Apr. 24, 2009.

FIELD OF THE INVENTION

The present invention relates to an electric power conversion apparatus, which is connected to an electric motor used as an actuator for an in-vehicle device such as an electric power steering system for a vehicle.

BACKGROUND OF THE INVENTION

In a conventional electric power conversion apparatus, mechanical relays are used to shut off electric connection between motor phase terminals of a three-phase electric motor and output terminals of an inverter circuit. If such a mechanical relay is used, reliability of its operation is lowered by foreign matters and the like, which are often jammed. The following patent document therefore proposes to use a power MOS-type field effect transistor in place of such a mechanical relay.

[Patent document] JP 2006-21645A

According to this proposal, the transistors are connected between a three-phase electric motor and an inverter circuit so that electrical connection and disconnection therebetween is controlled by a voltage applied to the gate of the transistor.

If a current required by the electric motor is increased, the amount of heat generated by the transistor tends to excessively increase in a period, in which the transistor is turned on to electrically connect the inverter circuit and the electric motor. If the heat generated by the transistor excessively increases, the reliability of the transistor will be lowered.

SUMMARY OF THE INVENTION

It is therefore an object of the present invention to provide an electric power conversion apparatus, which is capable of maintaining reliability of a transistor connected between an electric power conversion circuit and an electric motor used as an actuator in a vehicle.

According to the present invention, an electric power conversion apparatus is provided for a vehicle having an electric motor as an electric actuator of an in-vehicle device. The apparatus comprises an electric power conversion circuit and a power transistor. The transistor has a gate terminal, a source terminal and a drain terminal, and connects an output terminal of the electric power conversion circuit and a motor terminal of the electric motor through the source terminal and the drain terminal. The power transistor has the source terminal positioned between the gate terminal and the drain terminal.

BRIEF DESCRIPTION OF THE DRAWINGS

The above and other objects, features and advantages of the present invention will become more apparent from the following detailed description made with reference to the accompanying drawings. In the drawings:

FIGS. 2A to 2C are schematic views showing configuration and arrangement of a semiconductor relay used in the first embodiment;

DETAILED DESCRIPTION OF THE PREFERRED EMBODIMENT

An electric power conversion apparatus for a vehicle according to the present invention will be described in detail below with reference to embodiments, in which the apparatus is connected to an electric motor used in an electric power steering system, for example.

(First Embodiment)

Figure 1:
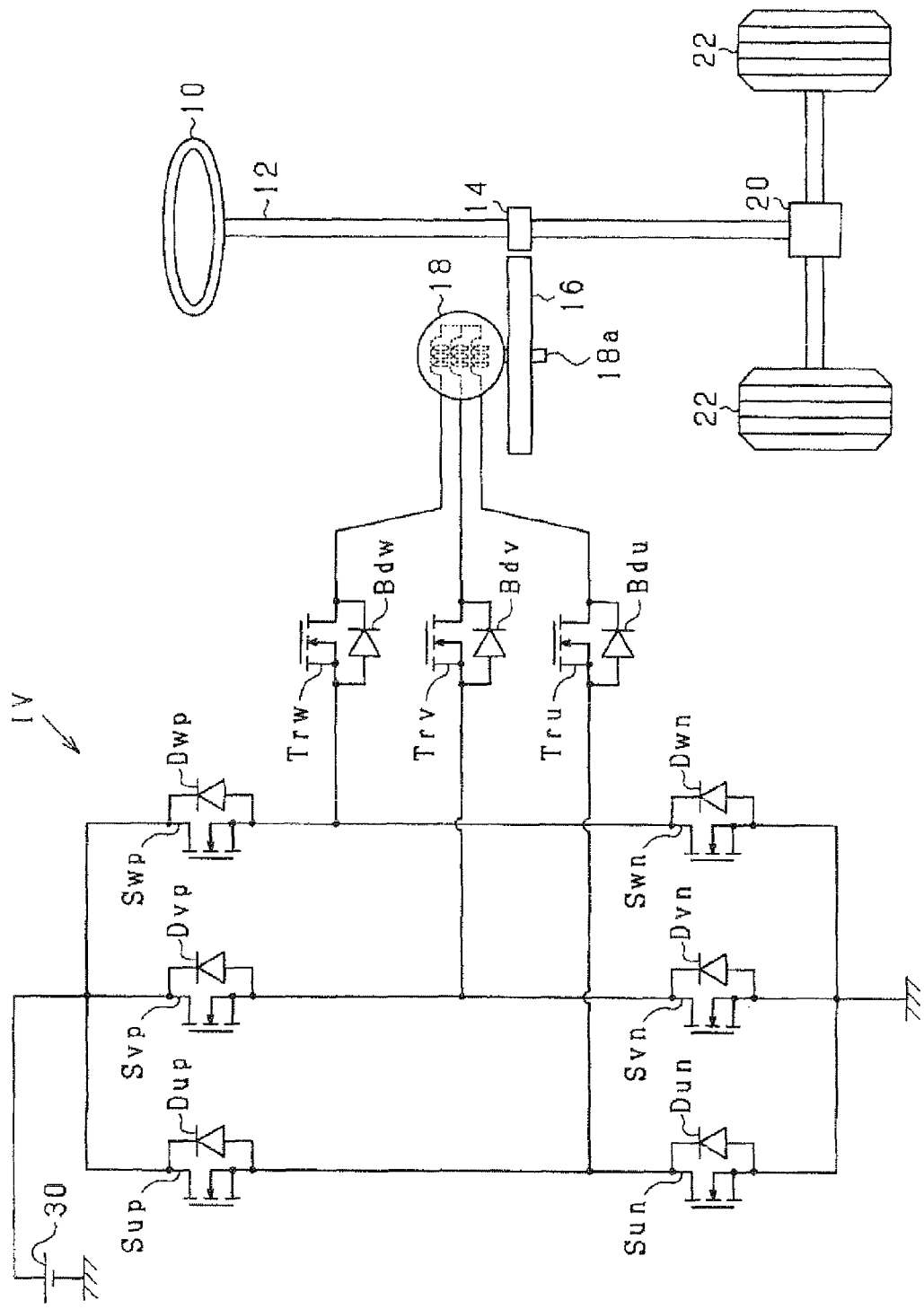
FIG. 1 is a circuit diagram showing an electric power conversion apparatus according to a first embodiment of the present invention.

Referring first to FIG. 1, a steering system for a vehicle provided as an in-vehicle device includes a steering wheel 10, an input shaft 12, a transmission 20, drive wheels 22 and the like. The steering wheel 10 is operable by a driver to change direction of travel of the vehicle. The input shaft 12 is rotatable in accordance with rotation operation of the steering wheel 10. The input shaft 12 is mechanically coupled with a main gear 14 to rotate together about the same rotation axis.

The main gear 14 is engaged with an assist gear 16. The assist gear 16 is mechanically coupled with an output shaft 18a of an electric motor 18 to rotate together about the same rotation axis.

The input shaft 12 is also mechanically coupled to the transmission 20 at its end, which is opposite to the steering wheel 10. The transmission 20 is provided to transfer the rotation of the input shaft 12 to the drive wheels by changing a ratio of the rotation. Thus, the steering wheel 10 is mechanically coupled to the drive wheels 22.

With the electric motor 18, the assist gear 16 and the like, the steering system operates as an electric power steering system. The electric motor 18 is provided as an electric actuator of the electric power steering system, so that it assists the steering operation of the driver in manually operating the steering wheel 10 to change the steering angle of the vehicle.

The electric motor 18 is a three-phase electric motor. The electric motor 18 is supplied with electric power of a battery 30 through an inverter circuit IV. The inverter circuit IV has a first series connection of switching elements Sup, Sun, a second series connection of switching elements Svp, Svn and a third series connection of switching elements Swp, Swn between the battery 30 and the ground. The junctions in the first, second and third series connections are connected to motor phase terminals of the windings of U-phase, V-phase and W-phase of the electric motor 18, respectively. N-channel power MOS field effect transistors Tru, Trv, Trw are used as the switching elements Sup, Sun, Svp, Svn, Swp, Swn and include respective body diodes Dup, Dun, Dvp, Dvn, Dwo, Dwn.

It becomes impossible to generate assist torque by the electric motor 18 in operating the power steering system, if a switching element of the inverter circuit IV has a short-circuit failure, for example. Even in this instance, the short-circuited part or the diode remains as a current supply path to the electric motor 18. The electric motor 18 operates as an electric power generator. As a result, torque is applied in reverse to the manual operation of the steering wheel 10 by the driver. It will thus become difficult for the driver to operate the steering wheel manually when the electric power steering system fails to short-circuit.

To avoid such difficulty, semiconductor relays Tru, Trv, Trw are provided between output terminals of the three phases of the inverter circuit IV and motor terminals of the three phases of the electric motor 18. Each of the semiconductor relays Tru, Trv, Trw is also a N-channel power MOS field effect transistor. Each of the transistor is formed with a body diode (Bdu, Bdv, Bdw), which is connected to be forward-biased from the source terminal to the drain terminal. That is, the anode and the cathode of each body diode Bdu, Bdv, Bdw are connected to the source and the drain of each semiconductor relay Tru, Trv, Trw. In the following description, the semiconductor relays Tru, Trv, Trw and the diodes Bdu, Bdv, Bdw are generally referred to as a semiconductor relay Tr and a diode Tr.

The source terminal of the semiconductor relay Tr is connected to the output terminal of the inverter circuit IV. The drain terminal of the semiconductor relay Tr is connected to the motor terminal of the electric motor 18. All of the diodes Bdu, Bdv, Bdw are connected to be forward-biased from the inverter circuit IV to the electric motor 18.

Thus, when the semiconductor relay Tr is turned off, the inverter circuit IV and the electric motor 18 are electrically shut off or disconnected from each other surely. The semiconductor relay Tr is formed with the diode Bd. Therefore, even when the semiconductor relay Tr is turned off, a current is allowed to flow between the output terminal of the inverter circuit IV and the motor terminal of the electric motor 18 through the diode Bd. According to the Kirchhoff's law, the sum of the three-phase currents of the electric motor 18 is zero. It is therefore necessary that, for a current to flow to the electric motor 18, there should be one phase, through which a current flows into the electric motor 18, and another phase, through which a current flows out from the electric motor 18. That is, two electric paths are required so that one electric path allows the current to flow from the inverter circuit IV to the electric motor 18 and the other electric path allows the current to flow from the electric motor 18 to the inverter circuit IV. Therefore, by arranging all the diodes Bdu, Bdv, Bdw in the same current flow (bias) direction as described above, it is surely prevented that the currents flow in the electric motor 18 when all the semiconductor relays Tru, Trv, Trw are turned off. That is, the inverter circuit IV and the electric motor 18 are electrically disconnected from each other surely.

The drain terminal of the semiconductor relay Tr is connected to the motor terminal of the electric motor 18, because the withstand voltage between the gate terminal and the drain terminal of the semiconductor relay Tr is higher than that between the gate terminal and the source terminal of the same. Since the current changes when the switching elements of the inverter circuit IV are turned on and off, inductance component of the electric motor 18 generates surge in the currents. This surge is also applied to the semiconductor relay Tr. The semiconductor relay Tr therefore should be sufficiently resistive to withstand such surge. It is effective to utilize the withstand voltage between the gate terminal and the drain terminal of the semiconductor relay Tr as a countermeasure to the surge of the electric motor 18 so that the required withstand voltage of the semiconductor relay Tr may be lowered as much as possible. For this reason, the drain terminal of the semiconductor relay Tr is connected to the terminal of the electric motor 18.

The semiconductor relay Tr is controlled to be in the turned-on condition while the manual operation of the steering wheel 10 should be assisted. It is very likely that the heat generated by the semiconductor relay Tr increases, because the current flowing in the electric motor 18 is comparatively large (for example, several tens to a hundred and several tens of amperes, assumedly more than 90 amperes). The semiconductor relay Tr is configured and arranged as shown in FIGS. 2A to 2C.

As shown in FIG. 2A, which is a top plan view, the transistor Tr has the drain terminal TD on its rear face side. The drain terminal TD is positioned to face a heat sink HS through an insulation film layer IF, which is provided as a heat insulation member. The heat sink HS is a heat radiation member and may be formed of aluminum or the like.

A semiconductor chip 32 of the semiconductor relay Tr is a vertical-type. Specifically, the semiconductor chip 32 is formed with a source region and a gate on its front (main) face side. The semiconductor chip 32 is formed with a drain area on the opposite side (rear face side) thereof. As shown in FIG. 2B, which is a bottom plan view, the drain terminal TD occupies most part of the rear face side of the transistor Tr. The drain terminal TD is shown as being exposed. According to this configuration, the drain area of the semiconductor chip 32 can be sized large to have high heat radiation performance. With the increased area of the drain terminal TD, the heat generated in the drain area can be radiated sufficiently. Since the drain terminal TD faces the heat sink HS, the heat radiation performance of the drain terminal TD is further enhanced.

The source region of the semiconductor chip 32, on the other hand, tends to be sized smaller than the drain region, although the same amount of current flows in both areas. Since the front face side of the semiconductor chip 32 is formed with not only the source region but also a part for contact with the gate, an area of contact between an electrical conductor (material of high thermal conductivity), which contacts the source region of the semiconductor chip 32, and the source region is limited.

Therefore, the semiconductor relay Tr is configured to have the source terminal TS between the gate terminal TG and the drain terminal TD. That is, the source terminal TS is positioned between the gate terminal TG and the drain terminal TD with respect to terminal parts, which extend in parallel one another on the same plane, among the gate terminal TG, the drain terminal TD and the source terminal TS. The distance between the semiconductor chip 32 and the source terminal TS can be shortened in comparison with a case, in which the drain terminal TD is positioned between the gate terminal TG and the source terminal TS. It is shown in FIG. 2C that the length of a part of a bonding wire 34, which electrically connects the source region and the source terminal TS of the semiconductor chip 32, between the source region and the source terminal TS is shorter than that of a part of a bonding wire 36, which electrically connects the gate and the gate terminal TG, between the gate and the gate terminal TG. The part of the bonding wire 34 between the source region and the source terminal TS does not contact a high thermal conductivity material and has a small surface area. Thus this part is inferior to the source terminal TS and the like with respect to heat radiation performance. It is preferred therefore to shorten the length of such a part as much as possible to enhance heat radiation performance in the source region. For this reason, the source terminal TS is positioned between the gate terminal TG and the drain terminal TD in the semiconductor relay Tr.

As described above, since the heat radiation performance of the drain terminal is high, the heat generated near the drain terminal TD can be radiated effectively by the heat radiation performance of the drain terminal TD. As a result, in the electric power steering system shown in FIG. 1, the heat generated at the electric motor 18 side can be radiated to the heat sink HS through the drain terminal TD.

The first embodiment has the following features.

(1) The semiconductor relay Tr has the source terminal TS between the gate terminal TG and the drain terminal TD. As a result, the heat generated in the source region can be radiated speedily to the source terminal TS. Thus, the temperature of the semiconductor relay Tr can be suppressed from rising and hence the reliability of the semiconductor relay Tr can be suppressed from being lowered.

(2) The drain region of the semiconductor chip 32 forming the semiconductor relay Tr is arranged to face the heat sink HS through the insulation film layer IF. As a result, the heat generated in the drain region can be speedily radiated to the heat sink HS.

(3) Each of the output terminals of the inverter circuit IV is connected to the corresponding one of the terminals of the electric motor 18 through one relay Tr. Further, the drain terminal TD of the semiconductor relay Tr is connected to the electric motor 18. As a result, the electric connection and disconnection between the inverter circuit IV and the electric motor 18 can be performed appropriately by controlling the voltage applied to the gate of the semiconductor relay Tr. In addition, the capability of withstanding surge at the electric motor 18 side can be increased and the heat generated at the electric motor 18 side can be appropriately radiated.

(Second Embodiment)

Figure 3:
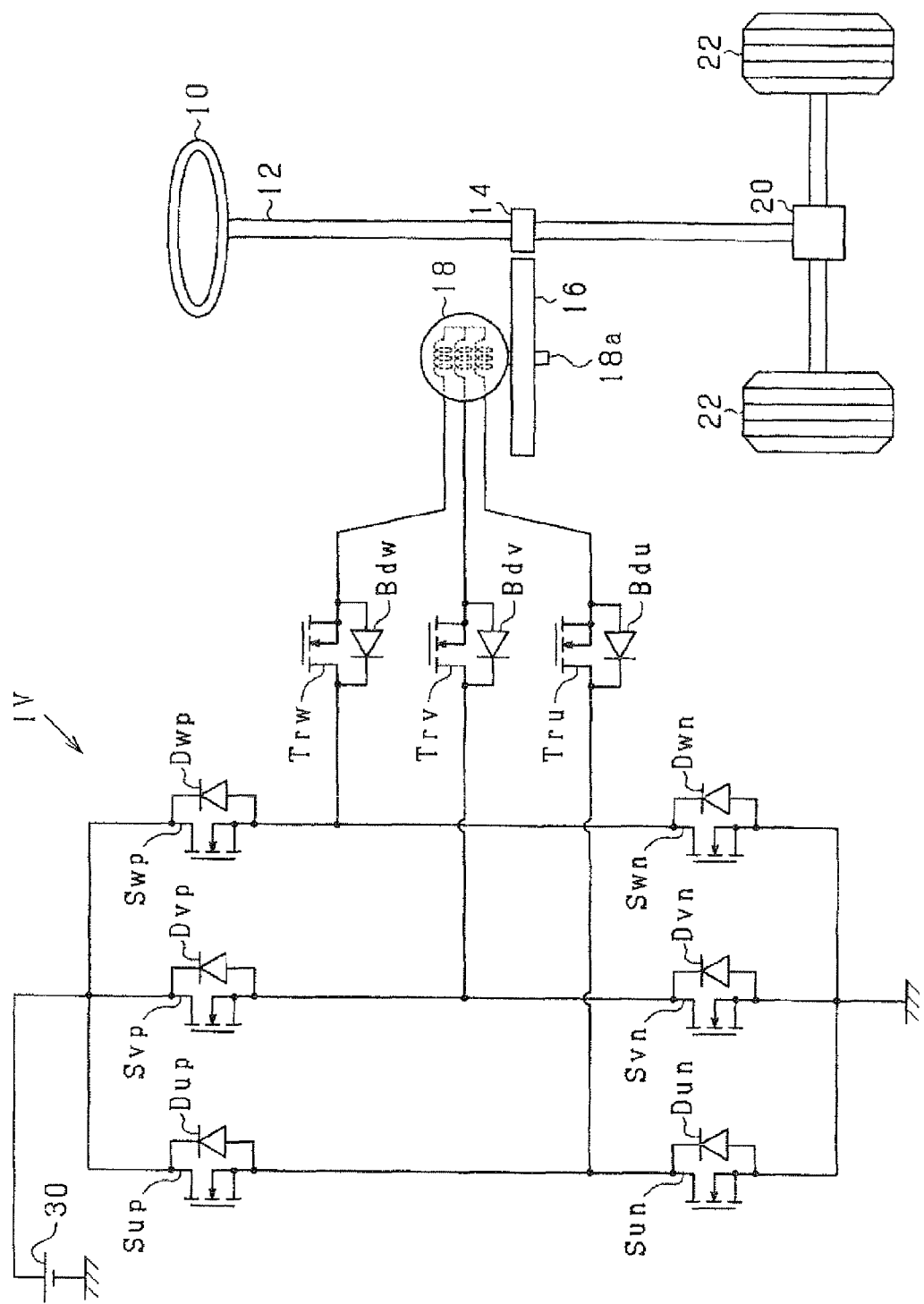
FIG. 3 is a circuit diagram showing an electric power conversion apparatus according to a second embodiment of the present invention.

An electric power conversion apparatus according to the second embodiment is shown in FIG. 3, in which the same or similar parts are designated by the same reference numerals as in the first embodiment.

In the second embodiment, the drains of the semiconductor relays Tru, Trv, Trw are connected to the output terminals of the inverter circuit IV. As a result, even if the electric path between the semiconductor relay Tr and the electric motor 18 is short-circuited to the ground, it is prevented that a short-circuit current flows from the battery 30 to the ground through the diode Bd of the semiconductor relay Tr. Since the drain of the semiconductor relay Tr has higher heat radiation performance, heat radiation at the inverter circuit IV side can be promoted by arranging the drain at the inverter circuit IV side.

The second embodiment has the following features in addition to the features (1) and (2) of the first embodiment.

(4) Each of the output terminals of the inverter circuit IV is connected to the corresponding one of the terminals of the electric motor 18 is connected through one semiconductor relay Tr, and the drain terminal TD of the semiconductor relay Tr is connected to the inverter circuit IV. As a result, the electrical connection and disconnection between the inverter circuit IV and the electric motor 18 can be appropriately performed by controlling the voltage applied to the gate of the semiconductor relay Tr. Further, even if the electric motor 18 side is short-circuited to the ground, a short-circuit current is prevented from flowing through the diode Bd of the semiconductor relay Tr. Still further, the heat generated at the inverter circuit IV side can be appropriately radiated to the heat sink HS.

(Modification)

The first and the second embodiments may be modified as follows.

Figure 4A:
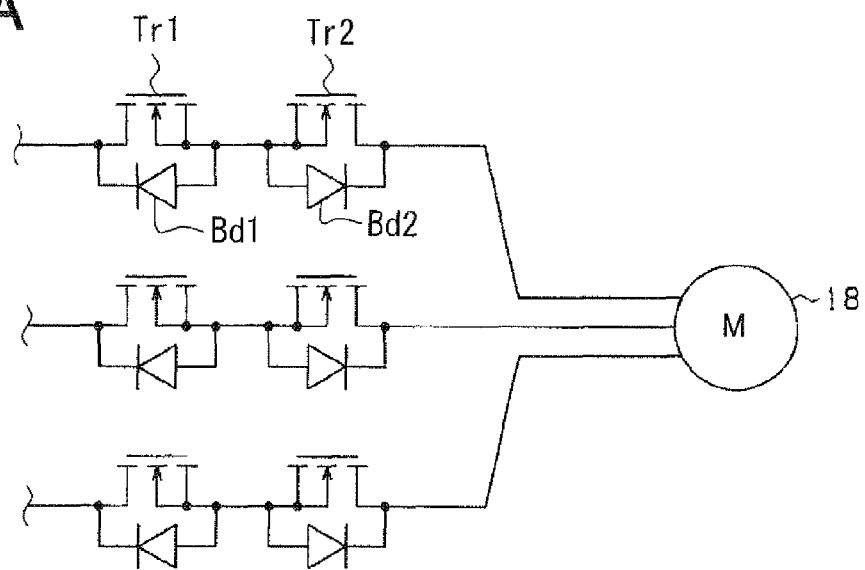
FIGS. 4A and 4B are circuit diagrams partly showing semiconductor relays according to modification of the first and second embodiments.
Figure 4B:
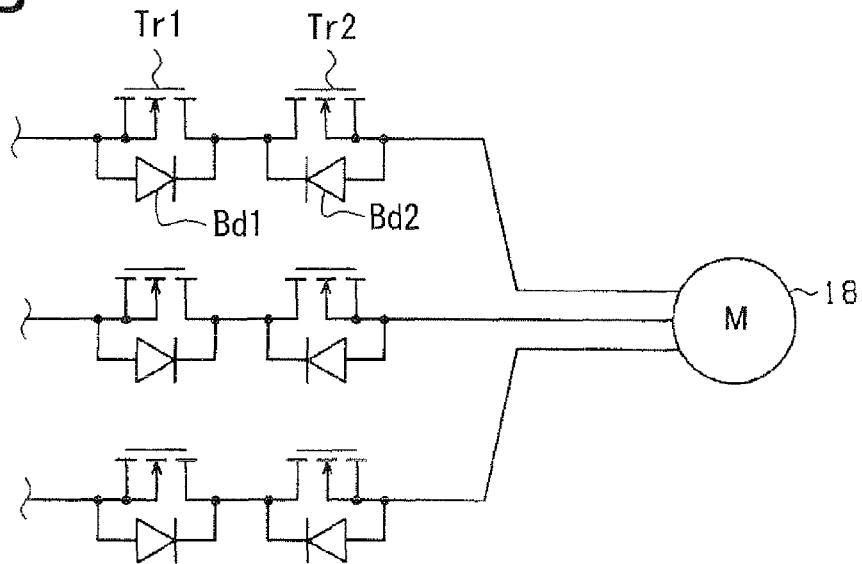

The transistor provided as the semiconductor relay Tr in each electric path between the inverter circuit IV and the electric motor 18 is not limited to one in number. For example, as shown in FIGS. 4A and 4B, a pair of transistors Tr1 and Tr2 may be provided as the semiconductor relay Tr in each electric path or phase of the electric motor 18. In these examples, the transistors Tr1 and Tr2 in each electric path are connected such that the anodes of respective body diodes Bd1 and Bd2 of the transistors Tr1 and Tr2 are connected to each other as shown in FIG. 4A or the cathodes of the same are connected to each other as shown in FIG. 4B. According to this arrangement, electrical connection between the inverter circuit IV and the electric motor 18 can be surely shut off. In the example of FIG. 4A, the drain of one of the transistors Tr1 and Tr2, specifically transistor Tr2, is connected to the electric motor 18 side and the drain of the other transistor Tr1 is connected to the inverter circuit IV side. As a result, the heat radiation performance of the drain terminals of the pair of transistors Tr1 and Tr2 can be advantageously utilized to radiate heat generated by the electric motor 18 and the inverter circuit IV.

The semiconductor relay Tr, which is provided as a switch for electrically connecting and disconnecting the electric motor 18 and the inverter circuit IV, is not limited to the N-channel MOS field effect transistor but may be a P-MOS field effect transistor.

The electric motor 18 is not limited to the three-phase brushless DC motor but may be a DC motor with brushes. In this case, the electric power conversion circuit IV may be configured as a conventional bridge circuit in place of the inverter circuit IV shown in FIGS. 1 and 3. In connecting the motor terminals of the electric motor 18 and the output terminals of the electric power conversion circuit IV through the power transistors, the advantages (3) of the first embodiment and (4) of the second embodiment can be attained by connecting the same terminals (anode or cathode) of the body diodes to the motor terminals of the electric motor 18.

The electric power steering system is not limited to the disclosed type but may be a different type, which is equipped with a variable gear system (VGS). In this different type of power steering system, the electric power conversion circuit may be provided, since such a system also needs a function of interrupting electrical connection between an electric power conversion circuit and an electric motor.

What is claimed is:

1. An electric power conversion apparatus for a vehicle having an electric motor as an electric actuator of an in-vehicle device, the apparatus comprising:
    an electric power conversion circuit; and
    a power transistor having a gate terminal, a source terminal and a drain terminal and connecting an output terminal of the electric power conversion circuit and a motor terminal of the electric motor through the source terminal and the drain terminal, the power transistor including a gate, a drain and a source of a semiconductor chip and having the source terminal positioned between the gate terminal and the drain terminal, wherein:
    the gate terminal, the drain terminal and the source terminal are connected to the gate, the drain and the source of the semiconductor chip, respectively;
    the drain terminal of the power transistor is connected to the motor terminal of the electric motor; and
    the semiconductor chip is a vertical-type, which has the source and the gate on one surface thereof and the drain on another surface opposite to the one surface;
    the drain terminal has one part, which is on the another surface and in a rectangular shape larger than the another surface in area size, and another part, which extends from one of four corners of the rectangular shape in parallel to the gate terminal and the source terminal; and
    the source terminal is shorter than the another part of the drain terminal.

2. The apparatus according to claim 1, further comprising:
an insulation member; and
a heat radiation member,
wherein the semiconductor chip of the power transistor has a drain region facing the heat radiation member through the insulation member.

3. The apparatus according to claim 1, wherein:
the output terminal of the electric power conversion circuit, the power transistor and the motor terminal of the electric motor are provided for each phase of the electric motor; and
the drain terminal of the power transistor, which is connected to the motor terminal of the electric motor, is the same among a plurality of phases of the electric motor.

4. The apparatus according to claim 3, wherein:
the drain terminal of the power transistor is connected to the motor terminal of each of the plurality of phases of the electric motor.

5. The apparatus according to claim 1, wherein:
the power transistor includes a pair of power transistor elements;
the output terminal of the electric power conversion circuit, the power transistor elements and the motor terminal of the electric motor are provided for each phase of the electric motor; and
the drain terminal of one of the pair of power transistor elements is connected to the motor terminal of the electric motor and the drain terminal of the other of the pair of power transistor elements is connected to the output terminal of the power conversion circuit.

6. The apparatus according to claim 1, wherein:
the electric motor is a three-phase brushless DC motor.

7. The apparatus according to claim 1, wherein:
the electric motor is provided to assist steering operation of an electric power steering system, which is provided as the in-vehicle device.

8. The apparatus according to claim 1, wherein:
the power transistor includes a body diode formed between a source and a drain thereof.

9. The apparatus according to claim 1, wherein:
the power transistor includes a pair of power transistor elements;
the drain terminal of one of the pair of power transistor elements is connected to the motor terminal of the electric motor and the drain terminal of the other of the pair of power transistor elements is connected to the output terminal of the power conversion circuit; and
sources of the pair of power transistor elements are connected to each other.

10. The apparatus according to claim 1, further comprising:
a source bonding wire connecting the source terminal and the source of the semiconductor chip;
a gate bonding wire connecting the gate terminal and the gate of the semiconductor chip;
wherein a length of the source bonding wire between the source terminal and the semiconductor chip is shorter than a length of the gate bonding wire between the gate terminal and the semiconductor chip.

11. The apparatus according to claim 1, further comprising:
the semiconductor chip has a rectangular shape;
the gate terminal is as short as the source terminal and shorter than the another part of the drain terminal; and
all of the gate terminal, the source terminal and the another part of the drain terminal are arranged at one of four sides of the rectangular shape of the semiconductor chip.

12. An electric power conversion apparatus for a vehicle having an electric motor as an electric actuator of an in-vehicle device, the apparatus comprising:
an electric power conversion circuit; and
a plurality of power transistors connecting a plurality of outputs of the electric power conversion circuit and a plurality of motor terminals of the electric motor, respectively, each power transistor having a gate, a source and a drain on a semiconductor chip and connecting one output terminal of the electric power conversion circuit and one motor terminal of the electric motor through the source and the drain, each power transistor having a source terminal positioned between a gate terminal and a drain terminal, wherein:
the gate terminal and the drain terminal are provided adjacently to the source terminal in the each power transistor;
the drain terminal of each power transistor is connected to a corresponding one of the motor terminals; and
the each power transistor is formed of a vertical-type semiconductor, which has the source and the gate on one surface of the semiconductor chip and the drain on another surface of the semiconductor chip opposite to the one surface;
the drain terminal has one part, which is on the another surface and in a rectangular shape larger than the another surface in area size, and another part, which extends from one of four corners of the rectangular shape in parallel to the gate terminal and the source terminal; and
the source terminal is shorter than the another part of the drain terminal.

13. The apparatus according to claim 12, further comprising:
a source bonding wire connecting the source terminal and the source of the semiconductor chip;
a gate bonding wire connecting the gate terminal and the gate of the semiconductor chip,
wherein a length of the source bonding wire between the source terminal and the semiconductor chip is shorter than a length of the gate bonding wire between the gate terminal and the semiconductor chip.

14. The apparatus according to claim 12, further comprising:
the semiconductor chip has a rectangular shape;
the gate terminal is as short as the source terminal and shorter than the another part of the drain terminal; and
all of the gate terminal, the source terminal and the another part of the drain terminal are arranged at one of four sides of the rectangular shape of the semiconductor chip.

* * * * *